US011140801B2

(12) United States Patent
Oyama et al.

(10) Patent No.: US 11,140,801 B2
(45) Date of Patent: Oct. 5, 2021

(54) DATA INPUT AND CONTROL DEVICES OF AN ELECTRONIC COMPONENT MOUNTING MACHINE

(71) Applicant: FUJI CORPORATION, Chiryu (JP)

(72) Inventors: Shigeto Oyama, Kariya (JP); Tomokatsu Kubota, Anjo (JP); Jun Iisaka, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 234 days.

(21) Appl. No.: 15/525,813

(22) PCT Filed: Nov. 11, 2014

(86) PCT No.: PCT/JP2014/079866
§ 371 (c)(1),
(2) Date: May 10, 2017

(87) PCT Pub. No.: WO2016/075760
PCT Pub. Date: May 19, 2016

(65) Prior Publication Data
US 2017/0325371 A1     Nov. 9, 2017

(51) Int. Cl.
*H05K 13/08*      (2006.01)
*H05K 13/04*      (2006.01)

(52) U.S. Cl.
CPC ..... *H05K 13/0882* (2018.08); *H05K 13/0452* (2013.01); *H05K 13/0853* (2018.08)

(58) Field of Classification Search
CPC ........... H05K 13/0882; H05K 13/0853; H05K 13/0452; H05K 13/046; H05K 13/0408; H05K 2203/0195
See application file for complete search history.

(56) References Cited

U.S. PATENT DOCUMENTS 6,216,341 B1 * 4/2001 Nakahara ........... H05K 13/0815
29/833
6,334,115 B1 * 12/2001 Kuribayashi ........ H05K 13/085
705/27.2
(Continued)

FOREIGN PATENT DOCUMENTS

EP      1081998 A2 *  3/2001  ........... H05K 13/041
EP      1 227 711 A1  7/2002
(Continued)

OTHER PUBLICATIONS

Extended European Search Report dated Nov. 13, 2017 in Patent Application No. 14905944.6.
(Continued)

*Primary Examiner* — Peter Dungba Vo
*Assistant Examiner* — Jeffrey T Carley
(74) *Attorney, Agent, or Firm* — Oblon, McClelland, Maier & Neustadt, L.L.P.

(57) ABSTRACT

A control device of an electronic mounting machine that controls an operation of a mounting head when an electronic component is mounted on a printed circuit board including multiple divided boards by using the mounting head having multiple suction nozzles; sets some of the multiple divided boards within the printed circuit board as one group based on positions of the multiple suction nozzles and positions of the multiple divided boards within the printed circuit board; and controls the multiple suction nozzles to mount the electronic components on the some of the divided boards within the one group at a same time.

11 Claims, 8 Drawing Sheets

(56) References Cited

U.S. PATENT DOCUMENTS

| | | | | |
|---|---|---|---|---|
| 6,571,462 | B1* | 6/2003 | Mimura | H05K 13/041 29/743 |
| 6,842,974 | B1* | 1/2005 | Maenishi | H05K 13/0478 29/832 |
| 7,185,422 | B2* | 3/2007 | Sakai | H05K 13/041 29/832 |
| 2002/0004980 | A1* | 1/2002 | Onitsuka | H05K 13/0469 29/832 |
| 2002/0042989 | A1* | 4/2002 | Kawase | H05K 13/041 29/832 |
| 2004/0033128 | A1* | 2/2004 | Kabeshita | H05K 13/085 29/740 |
| 2004/0080897 | A1* | 4/2004 | Kodama | H05K 13/0882 361/234 |
| 2004/0163243 | A1* | 8/2004 | Noda | H05K 13/081 29/834 |
| 2005/0065620 | A1* | 3/2005 | Maenishi | H05K 13/0452 700/28 |
| 2005/0274004 | A1* | 12/2005 | Yoshii | H05K 13/0812 29/743 |
| 2006/0064192 | A1* | 3/2006 | Shimizu | H05K 13/0882 700/121 |
| 2006/0174480 | A1* | 8/2006 | Kawada | G06T 7/001 29/833 |
| 2006/0229758 | A1* | 10/2006 | Maenishi | G06Q 10/06 700/121 |
| 2008/0163480 | A1* | 7/2008 | Kawasumi | H05K 13/0404 29/740 |
| 2009/0031559 | A1* | 2/2009 | Kawabata | H05K 13/085 29/743 |
| 2012/0123575 | A1* | 5/2012 | Shim | H05K 13/041 700/97 |
| 2015/0039115 | A1* | 2/2015 | Sagara | H05K 13/0853 700/106 |
| 2017/0116720 | A1* | 4/2017 | Hofmann | H05K 13/0053 |

FOREIGN PATENT DOCUMENTS

| | | | | |
|---|---|---|---|---|
| EP | 1227711 | A1 * | 7/2002 | ......... H05K 13/0478 |
| EP | 2 020 838 | A2 | 2/2009 | |
| EP | 2480061 | A2 * | 7/2012 | ......... H05K 13/0406 |
| JP | 63-133700 | A | 6/1988 | |
| JP | 2001-77596 | A | 3/2001 | |
| JP | 2002-176291 | A | 6/2002 | |
| JP | 2002-252499 | A | 9/2002 | |
| JP | 2003-124693 | A | 4/2003 | |
| JP | 2007-306040 | A | 11/2007 | |
| WO | WO-0205211 | A1 * | 1/2002 | ............ G06K 9/626 |
| WO | WO-2014174020 | A1 * | 10/2014 | ......... H05K 13/0015 |

OTHER PUBLICATIONS

English translation of the Japanese Office Action dated Aug. 31, 2018 in Patent Application No. 2016-558479, 3 Pages.

International Search Report dated Feb. 17, 2015 in PCT/JP2014/079866 filed Nov. 11, 2014.

Office Action dated Nov. 21, 2019 in corresponding European Patent Application No. 14 905 944.6, 39 pages.

\* cited by examiner

FIG.8
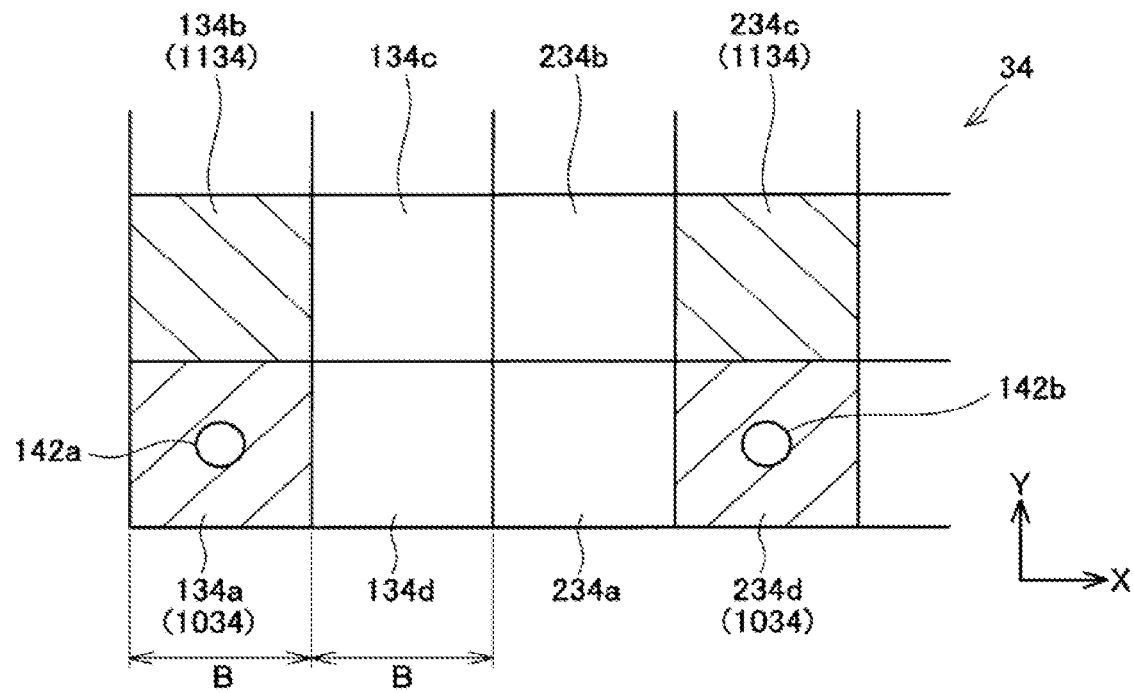
FIG.9
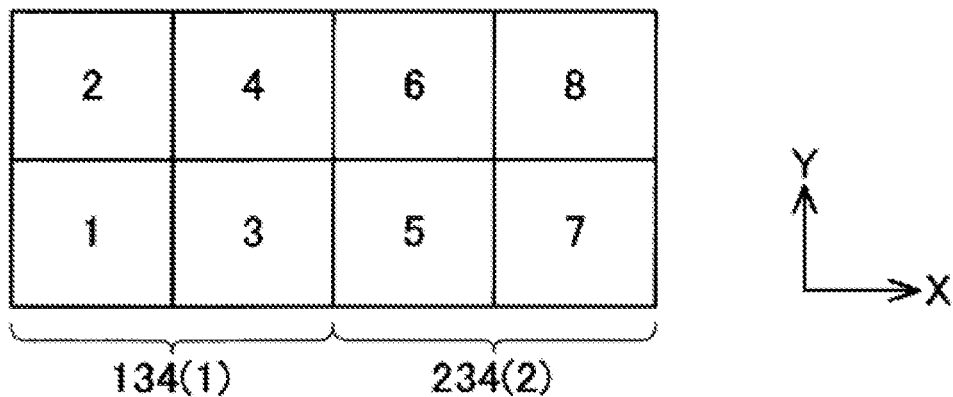
FIG.10
| GROUP No. | COORDINATES X | COORDINATES Y |
|---|---|---|
| 1 | 0 | 0 |
| 2 | 100 | 0 |

| DIVIDED BOARD No. | COORDINATES X | COORDINATES Y | MOUNTING ORDER |
|---|---|---|---|
| 1 | 0 | 0 | 3 |
| 2 | 0 | 50 | 2 |
| 3 | 50 | 0 | 4 |
| 4 | 50 | 50 | 1 |

| DIVIDED BOARD No. | COORDINATES X | COORDINATES Y | MOUNTING ORDER |
|---|---|---|---|
| 5 | 100 | 0 | 7(3) |
| 6 | 100 | 50 | 6(2) |
| 7 | 150 | 0 | 8(4) |
| 8 | 150 | 50 | 5(1) |

| POSITION WITHIN BOARD No. | CENTER COORDINATES X | CENTER COORDINATES Y | COMPONENT TYPE |
|---|---|---|---|
| 1 | 25 | 25 | A |

FIG.15

| DIVIDED BOARD No. | COORDINATES X | COORDINATES Y | MOUNTING ORDER |
|---|---|---|---|
| 1 | 0 | 0 | 3 |
| 2 | 0 | 50 | 2 |
| 3 | 50 | 0 | 4 |
| 4 | 50 | 50 | 1 |
| 5 | 100 | 0 | 7 |
| 6 | 100 | 50 | 6 |
| 7 | 150 | 0 | 8 |
| 8 | 150 | 50 | 5 |

FIG.16

| POSITION WITHIN BOARD No. | CENTER COORDINATES X | CENTER COORDINATES Y | COMPONENT TYPE |
|---|---|---|---|
| 1 | 25 | 25 | A |

FIG.17

| GROUP No. | COORDINATES X | COORDINATES Y |
|---|---|---|
| 1 | 0 | 0 |
| 2 | 100 | 0 |

FIG.18

| DIVIDED BOARD No. | COORDINATES X | COORDINATES Y | MOUNTING ORDER |
|---|---|---|---|
| 1 | 0 | 0 | 3 |
| 2 | 0 | 50 | 2 |
| 3 | 50 | 0 | 4 |
| 4 | 50 | 50 | 1 |

FIG.19

| POSITION WITHIN BOARD No. | CENTER COORDINATES X | CENTER COORDINATES Y | COMPONENT TYPE | NOZZLE TYPE |
|---|---|---|---|---|
| 1 | 10 | 10 | A | NOZZLE A |
| 2 | 30 | 30 | A | NOZZLE A |
| 3 | 20 | 20 | B | NOZZLE B |

FIG.20

| MOUNTING ORDER | POSITION WITHIN BOARD No. | GROUP No. |
|---|---|---|
| 1 | 1 | 1 |
| 2 | 2 | 1 |
| 3 | 1 | 2 |
| 4 | 2 | 2 |
| 5 | 3 | 1 |
| 6 | 3 | 2 |

DATA INPUT AND CONTROL DEVICES OF AN ELECTRONIC COMPONENT MOUNTING MACHINE

TECHNICAL FIELD

The present description relates to a control device of an electronic component mounting machine that mounts electronic components on a printed circuit board, and a data input device that inputs data to the control device thereof.

BACKGROUND ART

In JP-A-2001-77596 (hereinafter, referred to as PTL 1), an electronic component mounting machine of mounting electronic components on a printed circuit board including multiple divided boards is described. In the electronic component mounting machine, the electronic components to be mounted on each of the multiple divided boards are sucked in advance by using multiple suction nozzles. Specifically, the electronic components to be mounted on a first divided board and the electronic components to be mounted on the second divided board are sucked from an electronic component supply device (feeder) by using two suction nozzles. Then, amounting head is moved to a predetermined position on the printed circuit board such that the electronic components are mounted on both the first divided board and the second divided board. According to the electronic component mounting machine of PTL 1, by reciprocating the mounting head only once between the electronic component supply device and the printed circuit board, it is possible to mount the electronic component on the two divided boards (first divided board and second divided board).

SUMMARY

The electronic component mounting machine of PTL 1 does not consider offset values of the multiple divided boards. Therefore, after moving the mounting head to a position of the printed circuit board, it is necessary to move the mounting head to a mounting position of the electronic component within each divided board. In the electronic component mounting machine of PTL 1, although the electronic components are sucked and moved to the two suction nozzles, since it is necessary to move the mounting head when mounting the electronic components on each of the divided boards, mounting efficiency of the electronic component is reduced. An object of the present description is to provide a control device of the electronic component mounting machine capable of increasing productivity of the electronic component mounting machine more than the related art, and a data input device that inputs data to the control device.

A control device disclosed in the present description controls an operation of a mounting head of an electronic component mounting machine. The electronic component mounting machine mounts electronic components on the printed circuit board having multiple divided boards by using the mounting head having multiple suction nozzles. The control device sets some of the multiple divided boards within the printed circuit board to one group, based on positions of the multiple suction nozzles and positions of the multiple divided boards within the printed circuit board. In addition, the control device sucks the electronic components to be mounted on the divided board within the one group at the same time.

In the above-described control device, some of the multiple divided boards are set as one group based on the positions of the multiple suction nozzles and the positions of the multiple divided boards within the printed circuit board. Since it is possible to optimize the positions of suction nozzles and positions of the divided boards, it is possible to efficiently mount the electronic component sucked to the suction nozzle on the divided board. As a result, it is possible to increase productivity of the electronic component mounting machine more than the related art. The divided boards to be one group may be determined by the control device, and a user may input the selected boards to the control device by selecting the divided boards to be one group.

Another control device disclosed in the present description controls an operation of the mounting head of the electronic component mounting machine. The control device controls an operation of the mounting head when the electronic component is mounted on the printed circuit board including the multiple divided boards. The control device sets some of the multiple divided boards within the printed circuit board to one group. In addition, the control device controls an operation of the mounting head based on mounting position data, offset data, and mounting order data. The mounting position data is data relating to a mounting position of the electronic component within one divided board among the multiple divided boards within one group. The offset data is data relating to an offset value with respect to the one divided board of the multiple divided boards within one group. The mounting order data is data relating to an order of mounting the electronic component within one group.

In the control device, with respect to the mounting position of the electronic component, it is not necessary to memorize entire mounting positions within the group, and the mounting position of one divided board (reference divided board) among the multiple divided boards may be stored. The mounting position of the electronic component with respect to the divided board other than the reference divided board is determined based on the offset data between respective groups and the mounting position data of the electronic component within one divided board. Since the control device does not need to store the mounting position data of the electronic component other than the reference divided board, it is possible to decrease a memory of the control device.

The data input device disclosed in the present description inputs data to the above-described control device. The data input device includes a displaying device for displaying an image of the printed circuit board, and a selection device for selecting a divided board to be grouped based on the image displayed on the displaying device.

The data input device can determine data stored by the control device. Specifically, it is possible for a user to select the divided board to be grouped while the user confirms the image of the printed circuit board displayed on the screen of the displaying device. That is, the data input device not only inputs data to be stored by the control device but also can output data stored in the control device or to be stored in the control device on the display screen.

BRIEF DESCRIPTION OF DRAWINGS

FIG. 8 is a diagram for explaining the positional relationship between the printed circuit board and the suction nozzle.

FIG. 9 shows a part of a group in a printed circuit board of a first embodiment.

FIG. 10 shows group coordinates of the first embodiment.

FIG. 15 shows coordinates of a divided board and a mounting order of an electronic component of the second embodiment.

FIG. 16 shows mounting coordinates of the electronic component within a reference divided board of the second embodiment.

FIG. 17 shows group coordinates of a third embodiment.

FIG. 18 shows coordinates of a divided board and a mounting order of electronic components of the third embodiment.

FIG. 19 shows mounting coordinates of the electronic components and a type of a suction nozzle to be used within a reference divided board of the third embodiment.

FIG. 20 shows a mounting order, a type, and a group of the electronic components of the third embodiment.

DESCRIPTION OF EMBODIMENTS

Figure 1:
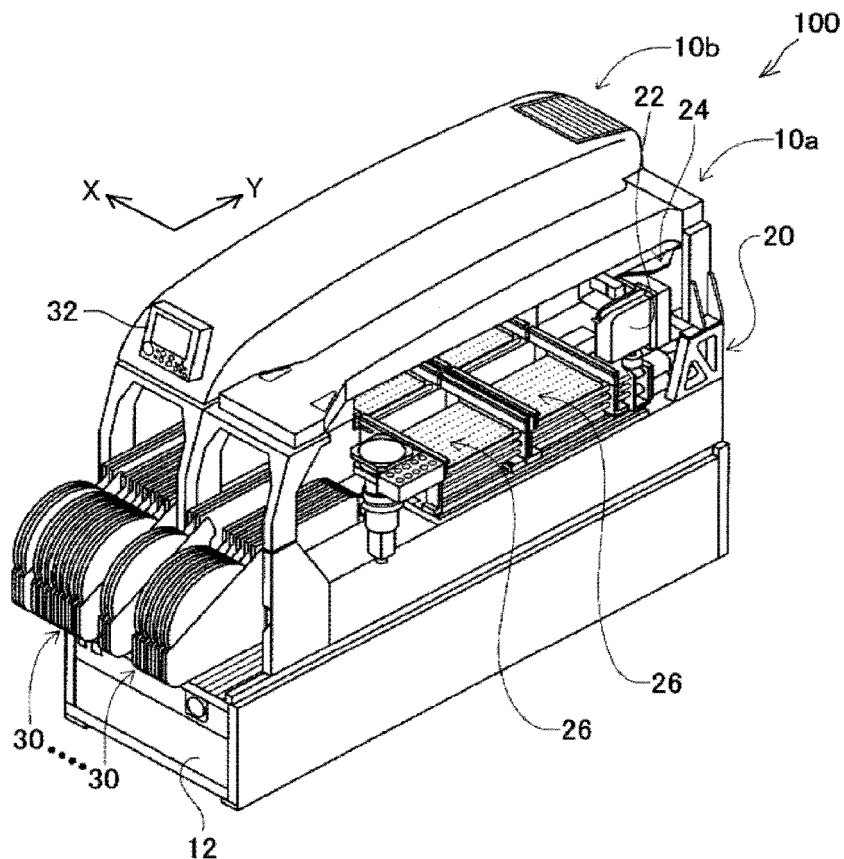
FIG. 1 shows appearance of an electronic component mounting machine.

Hereinafter, some technical features an electronic component mounting machine disclosed in the present description, a control device of controlling an operation of an electronic component mounting machine, and a data input device of inputting data to a control device thereof will be described. Each of the following matters has technical usefulness by themselves.

The electronic component mounting machine mounts electronic components on a printed circuit board having multiple divided boards. The electronic component mounting machine includes a mounting head having multiple suction nozzles. An operation of the mounting head and the suction nozzle is controlled by the control device. An execution program (operation program of mounting head and suction nozzle) of the control device may be created by the control device in accordance with coordinates of a divided board, positions of the suction nozzles, or the like within the printed circuit board, and may be created (data input) by a user of the electronic component mounting machine. The control device may be integrated with the electronic component mounting machine, and may be separated from the electronic component mounting machine.

In the control device, some of multiple divided boards may be set as one group within the printed circuit board. The control device itself may have a function of forming multiple groups by processing the multiple the divided boards as one group. With respect to one printed circuit board, one group may be implemented, and multiple groups may be implemented. The control device may have a function of causing the multiple groups to be created, and each divided board to be assigned to any one of the group. The control device may determine the one group based on the positions of the multiple suction nozzles and the positions of the multiple divided boards in the printed circuit board. The control device may store an order of mounting the electronic components sucked by the suction nozzle within one group. The control device itself may determine the order of mounting the electronic components sucked by the suction nozzle within one group.

The control device may have a storage device (memory) of storing position information of respective groups within the printed circuit board, offset value information between respective groups, positional information of each divided board within each group, a type of the electronic components to be mounted on the divided board, a mounting order of the divided board within each group, or the like.

As an example, the control device may have a function of causing, to be stored, position data of one divided board among the multiple divided boards within one group, offset data with respect to the one divided board of the multiple divided boards within one group, and an order of mounting the electronic components within one group. In this case, by considering the one divided board within the group as a reference divided board, and by storing the offset value of another divided board with respect to the position data (coordinates) of the reference divided board and the position data of the reference divided board, it is possible to obtain the position data of the entire divided boards within the group. If the position data of the entire divided boards within the group is obtained by the position data of the reference divided board and the offset data with respect to the reference divided board of another divided board, although the position data of the entire divided boards is not stored, it is possible to mount the electronic components on the entire divided boards.

The divided board included in one group may be selected so as to minimize movement of the mounting head. As an example, in order to minimize difference of an interval between suction nozzles and an interval (offset value of another divided board with respect to reference divided board) between divided boards within one group, some of the multiple divided boards within the printed circuit board may be set as one group. More preferably, in order to coincide the interval between suction nozzles with an interval between divided boards, the divided board included in one group may be selected. By reducing a movement distance of the mounting head, it is possible to reduce a mounting time of the electronic component. It is possible to improve production efficiency of the electronic component mounting machine.

As described above, with respect to one printed circuit board, one group may be formed, and multiple groups may be formed. In addition, one electronic component may by mounted on the one divided board, and multiple electronic components may be mounted on the one divided board. In a case where the multiple groups are formed, the control device may store the offset data between respective groups. The offset data between respective groups is the offset value of another group with respect to the position data (coordinates) of the reference group when one group is considered as a reference group. In addition, in a case where the multiple electronic components are mounted on the one divided board on which the multiple groups are formed, the control device may store the offset data (hereinafter, referred to as first offset data) between respective groups, the offset data (hereinafter, referred to as second offset data) between the multiple divided boards within one group, and mounting position data (hereinafter, referred to as mounting position data within the divided board) of the electronic component within one divided board. The second offset data is the offset value of another divided board with respect to the position data of the reference divided board.

As described above, in a case where the same product (board on which electronic components are mounted) is manufactured, by the second offset data and the mounting position data within the divided board, it is possible to obtain the mounting position data of the electronic component with respect to the entire divided boards included within one group. Furthermore, by using the first offset data, it is possible to obtain the position data for mounting the electronic component with respect to the entire divided boards included in one printed circuit board. For example, in a case where the printed circuit board is divided into ten groups, ten divided boards are included within each group, and ten electronic components are mounted on each divided board, 1,000 pieces of the position data for mounting the electronic components are required. That is, originally, it is necessary for the control device to store 1,000 pieces of position data. However, in a case of the above-described embodiment, by only storing ten pieces of first offset data, ten pieces of second offset data, and mounting position data within ten pieces of divided boards, it is possible to substantially obtain the position data of entire electronic components. It is possible to decrease an amount of the storage device (memory) installed on the control device.

The control device may determine an order for mounting the electronic components based on the offset data (first offset data) between respective groups, the offset data (second offset data) between the multiple divided boards within one group, and the mounting position data (mounting position data within divided board) of multiple electronic components within the one divided board. In this case, the control device may determine the order for mounting the electronic component in order to decrease the movement distance of the mounting head, the number of times of replacement of the suction nozzle, or the like. The control device may store the order (hereinafter, referred to as mounting order data) for mounting the electronic component.

In a case where the electronic components are mounted based on the first offset data, the second offset data, the mounting position data within the divided board, and the mounting order data, the mounting order data may be determined so as to continuously mount the electronic components on the selected mounting position, by selecting mounting positions of at least one electronic component from each divided board included in one group and by using the multiple suction nozzles. In this case, the selected mounting position may be the same position within each divided board. That is, the mounting position selected from each divided board within one group may be an offset by the same amount as the offset value of each second offset data. The mounting order data may select the mounting positions of at least one electronic component within each group.

In a case where the execution program of the control device is input by a user of the electronic component mounting machine, the execution program is input to the control device by using the data input device. In this case, the data input device may include a displaying device and a selection device. The displaying device may display an image of the printed circuit board. The displaying device may display each divided board included within the printed circuit board. In addition, the displaying device may display the divided board within the printed circuit board for each group. The displaying device may display the image of the printed circuit board, the group, or the divided board together with those coordinate data (typically, X-Y coordinate data). Furthermore, the displaying device may display the mounting head having the multiple suction nozzles on a screen displaying the printed circuit board at an arbitrary position. The control device and the data input device may be integrated with each other, or may be separated from each other. For example, the control device may be integrated with the electronic component mounting machine, and the data input device may be separated from the electronic component mounting machine. That is, the control device may be disposed inside an electronic component machine, and the data input device may be disposed outside an electronic component mounting machine.

The selection device may be able to select the divided board to be grouped based on the image displayed on the displaying device. The selection device may be able to select one among the multiple divided boards within the group. The group or the divided board selected by the selection device may be displayed by being distinguished from the group or the divided board not selected on the displaying device.

Hereinafter, with reference to drawings, the electronic component mounting machine, the control device of the electronic component mounting machine, and the data input device of inputting data to the control device disclosed in the present description will be described. First, with reference to FIG. 1, an electronic component mounting machine 100 will be described. The electronic component mounting machine 100 is a device for mounting the electronic component on the printed circuit board. The electronic component mounting machine 100 may also be referred to as a surface mounting machine or a chip mounter. In the electronic component mounting machine 100, two electronic component mounting machines 10a and 10b are fixed to a system base 12. Hereinafter, a direction in which the electronic component mounting machines 10a and 10b are disposed is defined as an X direction, and a horizontal direction perpendicular thereto is defined as a Y direction.

The electronic component mounting machines 10a and 10b have substantially the same structure. Therefore, in the following description, the electronic component mounting machine 10a will be described, and the description of the electronic component mounting machine 10b will be omitted. The electronic component mounting machine 10a includes a frame 20 and multiple first feeders 30 fixed to the frame 20. The multiple first feeders 30 are detachably attached to the frame 20. Each of first feeders 30 accommodates the multiple electronic components. The first feeders 30 feed the electronic components to a mounting head 22. The first feeder is a tape type feeder for accommodating the multiple electronic components on a carrier tape.

The electronic component mounting machine 10a includes two board conveyance devices 26. Each board conveyance device 26 conveys the printed circuit board in the X-direction. Each board conveyance device 26 is connected in series to the board conveyance device 26 of the electronic component mounting machine 10b. The electronic component mounting machine 10*a* includes a mounting head 22 and a head moving device 24 of moving the mounting head 22 in the X-direction and the Y-direction. The head moving device 24 moves the mounting head 22 in a predetermined order with respect to the printed circuit board on the multiple first feeders 30 and the board conveyance devices 26. The multiple suction nozzles are provided in the mounting head 22, pick up and hold the electronic components from the first feeder 30, convey them to the printed circuit board on the board conveyance device 26, and mount them on the printed circuit board. The board conveyance device 26 conveys the printed circuit board on which mounting of the electronic component is finished to a board conveyance device of the electronic component mounting machine 10*b*. A data input device 32 is provided above the electronic component mounting machine 10*b*. Various settings with respect to the electronic component mounting machines 10*a* and 10*b* can be input to the control device by using the data input device 32. In addition, the data input device 32 can be performed to select and display the divided board which will be described below.

Figure 2:
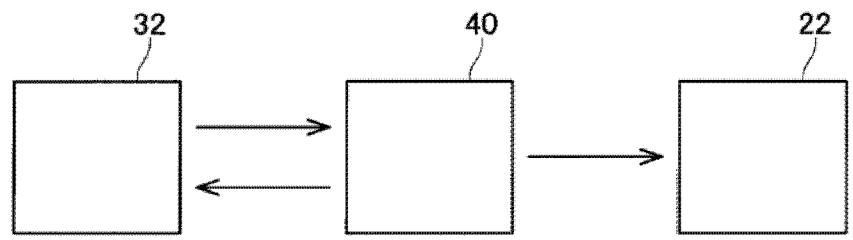
FIG. 2 shows a diagram for explaining relationship of a data input device and a control device.
Figure 3:
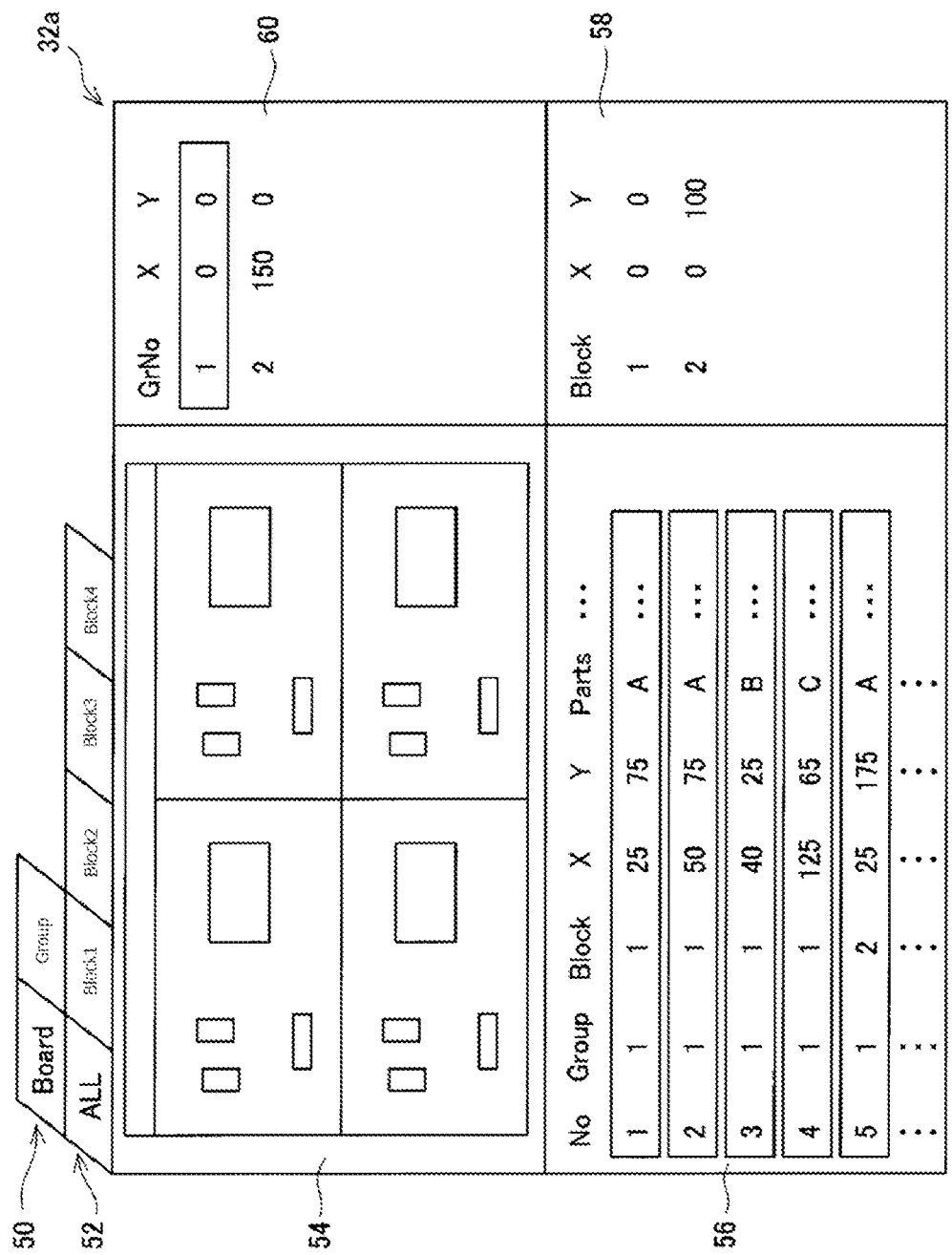
FIG. 3 shows an image displayed on a screen of the data input device.
Figure 4:
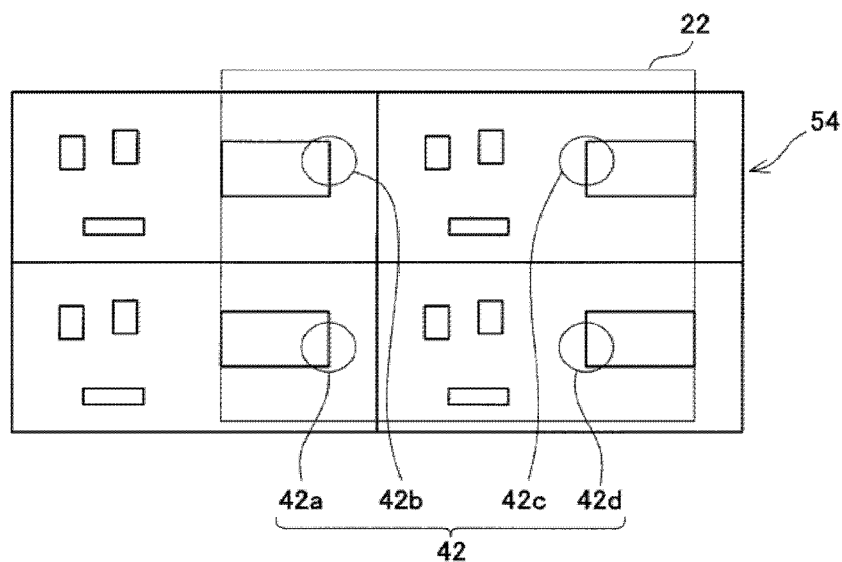
FIG. 4 shows a printed circuit board and suction nozzles displayed on the screen of the data input device.

With reference to FIG. 2 to FIG. 4, the data input device 32 and a control device 40 will be described. The control device 40 controls an operation of the mounting head 22, and controls the mounting position and the mounting order of the electronic component with respect to a printed circuit board 34. As described in FIG. 3, information programmed in the control device 40 can be displayed on a screen 32*a* of the data input device 32. A board/group selection section 50, a display divided board selection section 52, a board layout display section 54, a coordinates display section 56, an offset amount within the group display unit 58, and an inter-group offset amount display section 60 are displayed on the screen 32*a*. By selecting a tab of the board/group selection section 50, display of the board layout display section 54 and the coordinates display section 56 can be switched between divided board (board) unit and group unit. In a case where "group" is selected in the board/group selection section 50, the tab of the display divided board selection section 52 is changed from "block 1, 2 . . . " to "group 1, 2 . . . ".

By selecting the tab of the display divided board selection section 52, display of the board layout display section 54 and the coordinates display section 56 can be switched between the entirety (ALL) of the printed circuit board and the selected group (or block). In a case where the entirety (ALL) of the printed circuit board is selected, an image of the entirety of the printed circuit board is displayed on the board layout display section 54, and coordinates of the entire electronic component mounted on the printed circuit board are displayed on the coordinates display section 56. In a case where a specific group is selected in the display divided board selection section 52, the divided board within the selected group is displayed on the board layout display section 54, coordinates of the electronic component mounted on the divided board within the selected group is displayed on the coordinates display section 56, and an offset amount between the respective groups is displayed on the offset amount within the group display unit 58.

When the entirety (ALL) of the printed circuit board is selected in the display divided board selection section 52, by selecting some of the divided boards to be set one group among the multiple divided boards displayed on the board layout display section 54, and by selecting a group determination unit (not illustrated) by a user, it is possible to determine one group. In addition, when one divided board is selected among the multiple divided boards displayed on the board layout display section 54, the selected divided board is represented by a color different from that of another divided board, and a background color of coordinates representing a corresponding divided board displayed on the coordinates display section 56 is displayed by a color different from a background color of coordinates of another divided board.

As described in FIG. 4, it is possible to display an image obtained by overlapping the image of the printed circuit board with an image of the mounting head 22 on the board layout display section 54. Positions of suction nozzles 42*a* to 42*d* are also displayed on the image of the mounting head 22. The user can move the image of the mounting head 22, while intervals between the suction nozzles 42*a* to 42*d* are maintained. Therefore, the user can set one group while confirming positions of the suction nozzles 42*a* to 42*d* and positions of the divided boards on a screen.

The user can input the operation program of the mounting head 22 to the control device 40 by using the data input device 32. The user can input the entirety of the operation program of the mounting head 22, and can input a part (for example, setting of origin of printed circuit board 34, mounting order of electronic component within one divided board, or the like) of the operation program to the control device 40.

Hereinafter, with reference to FIG. 5 to FIG. 8, a selection (determination) method of group will be described. FIG. 5 to FIG. 8 show schematically a shape of the printed circuit board 34 and a suction nozzle 42. In addition, in FIG. 6 and FIG. 8, a part of the divided boards among the divided boards included in the printed circuit board 34.

Figure 5:
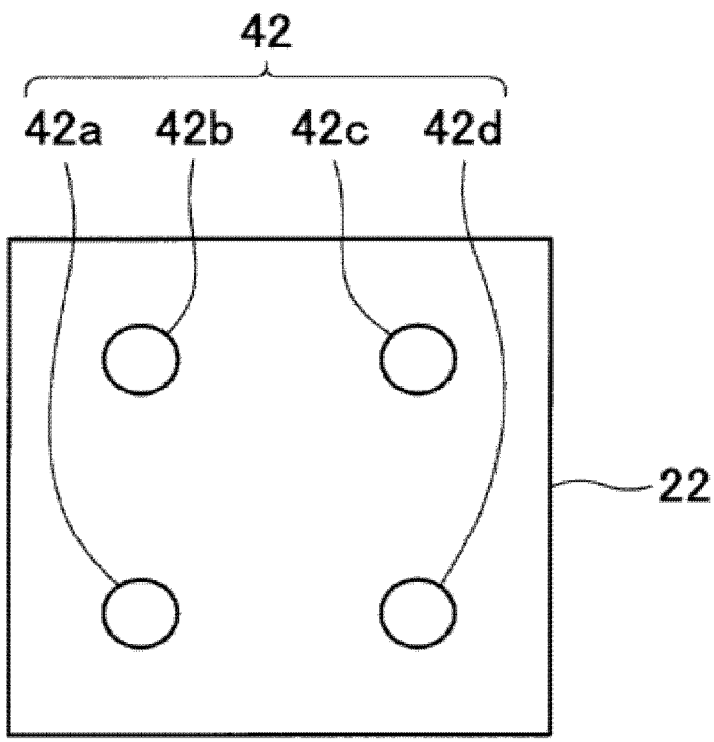
FIG. 5 schematically shows a mounting head and the suction nozzle.

As described in FIG. 5, the mounting head 22 includes four suction nozzles 42*a* to 42*d*. In addition, as described in FIG. 6, one group 134 is configured by four divided boards 134*a* to 134*d* among the printed circuit boards 34. In this case, when the entire suction nozzles 42*a* to 42*d* suck the same electronic components, and moves the mounting head 22 to a predetermined position on the printed circuit board 34, the suction nozzles 42*a* to 42*d* are opposed at the same positions of respective divided boards 134*a* to 134*d*. Therefore, after moving the mounting head 22 to a predetermined position on the printed circuit board 34, it is possible to mount the electronic components on respective divided boards 134*a* to 134*d* without further moving the mounting head 22.

Figure 7:
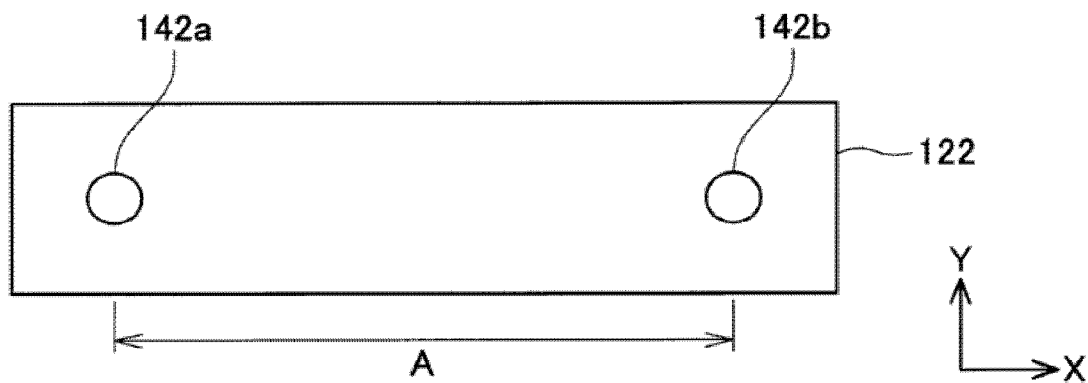
FIG. 7 schematically shows the mounting head and the suction nozzle.

Next, a case where the offset value between divided boards is different from an interval of the suction nozzles will be described. FIG. 7 shows a mounting head 122 including two suction nozzles 142*a* and 142*b*. The suction nozzles 142*a* and 142*b* are disposed in an X-axis direction. When the mounting head 122 is moved on the printed circuit board 34, the suction nozzles 142*a* and 142*b* are placed on a divided board 134*a* and a divided board 234*d*. Therefore, in a case where the electronic components are mounted on the printed circuit board 34 by using the mounting head 122, the divided boards 134*a* and 234*d* at positions which are separated from each other by three positions are set as one group 1034. Similarly, divided boards 134*b* and 234*c* are set as one group 1134. When the same electronic components are sucked to the suction nozzles 142*a* and 142*b*, and the mounting head 122 is moved to a predetermined position on the printed circuit board 34, it is possible to mount the electronic components on the divided board within one group without further moving the mounting head 122.

Here, a method of selecting the divided board to be set as one group will be described. The reference divided board and the divided board to be grouped are selected by the following procedures (1) to (3).

(1) When an interval between suction heads is set as an interval A and an interval between adjacent divided boards is set as the interval B, a coefficient β satisfying the interval A 0.5× the interval B ×the coefficient β (counting number β is integer) is calculated.

(2) When the divided board to be the same group as that of the divided board (for example, divided board 134a) to be a reference is separated by C positions from the reference divided board, the number of positions C=0.5×β is calculated, and an integer D that is an integer part of the number of positions C is extracted.

(3) The divided board (divided board 234d) at a position which is separated by D positions in the X-axis direction from the reference divided board (divided board 134a) and the reference divided board is set as one group.

In a case where the mounting head including three or more the suction nozzles in the X-axis direction is used, selection of the divided board to be the same group as that of the reference divided board in the procedure by using an interval between the suction heads of the first and second positions as the interval A, and similarly, selection of the divided board to be the same group as that of the reference divided board in the procedure by using an interval between the suction heads of the second and third positions as the interval A, may be repeated. In addition, in a case (for example, mounting head 22 of FIG. 5) where the mounting head including the multiple suction nozzles in a Y-axis direction is used, the group may be determined by repeating the same procedure as the procedure by using the interval of the suction head in the Y-axis direction as the interval A. In a case where the mounting head of a type in which multiple suction heads are disposed in a circumferential direction, the divided board close to the interval between the suction heads may be selected as one group.

First Embodiment

With reference to FIG. 9 to FIG. 13, data stored in the control device 40 and the order for mounting the electronic components on the printed circuit board 34 will be described. In the embodiment, an example in which the electronic components are mounted on the printed circuit board 34 shown in FIG. 6 will be described by using the mounting head 22 shown in FIG. 5. In the embodiment, an example in which one electronic component is mounted on each divided board will be described.

Figure 6:
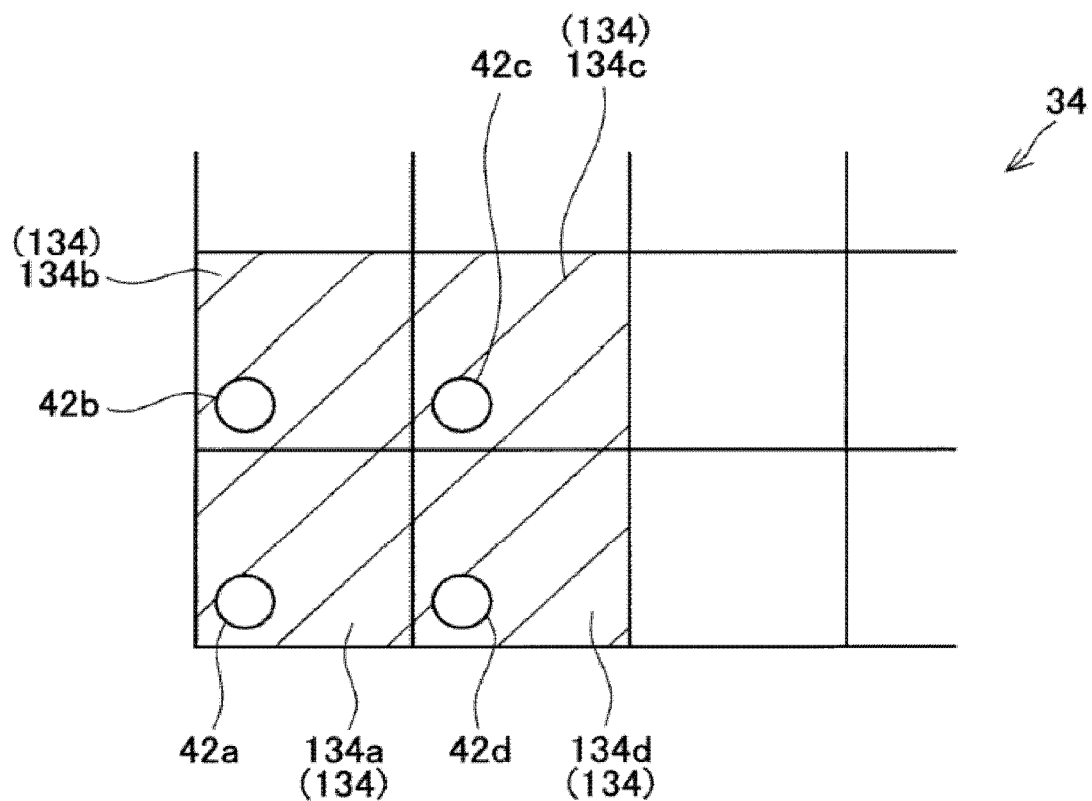
FIG. 6 is a diagram for explaining positional relationship between the printed circuit board and the suction nozzle.

FIG. 9 shows the group 134 and a group 234 adjacent to the group 134 among the printed circuit board 34 shown in FIG. 6. In the following description, the group 134 is referred to as a group 1, and the group 234 is referred to as a group 2. In addition, numbers 1 to 8 attached to the divided board are numbers of the divided board stored in the control device 40. In the following description, boards are referred to as divided boards 1 to 8. Data shown in FIGS. 10, 11, and 13 is stored in the control device 40.

FIG. 10 shows coordinates of the group 1 and the group 2 stored in the control device 40. More specifically, the coordinates represented in the group 1 are coordinates of a portion closest to the origin (X and Y=0) of a divided board 1, and coordinates represented in the group 2 are coordinates of a portion closest to the origin of a divided board 5. The coordinates of the group 1 and the group 2 can be referred to as the origin of the group 1 and the group 2. The coordinates of the group 2 correspond to the offset data (first offset data) with respect to the group 1 (reference group).

Figures 11, 12, 13, 14:
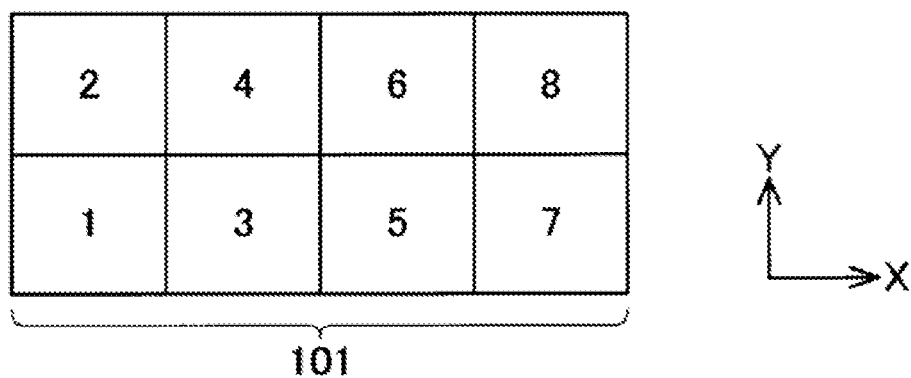
FIG. 11 shows coordinates of the divided board of the first embodiment and a mounting order of the electronic component.
FIG. 12 shows the coordinates of the divided board of the first embodiment and the mounting order of the electronic component.
FIG. 13 shows mounting coordinates of the electronic component within a reference divided board of the first embodiment.
FIG. 14 shows a part of a group in a printed circuit board of a second embodiment.

FIG. 11 shows coordinates of the divided boards 1 to 4 stored in the control device 40, and a mounting order of the electronic components. That is, FIG. 11 shows coordinates of the divided board and the mounting order included in the group 1. The coordinates of the divided boards 1 to 4 can be referred to as the origins of respective divided boards 1 to 4. Coordinates of divided boards 2 to 4 correspond to the offset data (second offset data) with respect to the divided board 1 (reference divided board).

FIG. 12 shows coordinates of the divided boards 5 to 8 and a mounting order of the electronic components. The coordinates of the divided boards 5 to 8 and the mounting order are not stored in the control device 40. The coordinates and the mounting order shown in FIG. 12 are obtained by data shown in FIG. 10 and FIG. 11. Specifically, a numerical value of the coordinates (first offset data) of the group 2 shown in FIG. 10 is added to a numerical value of the coordinates shown in FIG. 11. The mounting order shown in FIG. 12 is a mounting order through the group 1 and the group 2. In addition, numerical values shown in parentheses are mounting orders of the electronic components within the group 2, and the same as the mounting order of the electronic component in the group 1 shown in FIG. 11.

FIG. 13 shows a type (component A) of the electronic components mounted on the divided board 1, and the center coordinates of the electronic component when the electronic components are mounted on the divided board 1. Specifically, the coordinates (origin) of the divided board 1 represent coordinates at which the center of the electronic component is positioned.

Data shown in FIGS. 10, 11, and 13 is stored in the control device 40. The control device 40 drives the mounting head 22 based on these data and thereby mounts the electronic component A on a divided board 2 so as to set the center of an electronic component A in coordinates X=25 and Y=75, for example, at the second position from the start of the mounting. In addition, the electronic component A is mounted on a divided board 6 of the group 2 so as to set the center of the electronic component A in coordinates X=125 and Y=75, at the sixth position from the start of the mounting. As described above, the control device 40 does not store data of the coordinates and the mounting order with respect to the divided boards 5 to 8 within the group 2 shown in FIG. 12. Therefore, it is possible for the control device 40 to decrease a memory capacity compared to the control device of storing data of the coordinates and the mounting order with respect to the entire divided boards on which the electronic components are mounted.

Here, a determining method of numbers (case of FIG. 9, numbers 1 to 8) assigned to each divided board will be described.

(1) The numbers are assigned in an order from the origin (X and Y=0) to each of the divided boards included in the group 1. The numbers assigned to the divided boards within the group 1 are set as numbers within a reference group. In a case of FIG. 9, after the numerical values of the coordinates of an X-axis are assigned to the entirety of the divided boards (divided boards 1 and 2) close to the origin as the numbers, and the numerical values of the coordinates of the X-axis are assigned to the entirety the divided boards (divided boards 3 and 4) close to the next origin as the numbers.

(2) By setting a group number as D, the number of the divided boards included in the group as E, and numbers within the reference group assigned to the divided board within the group 1 corresponding to the divided board thereof as F, (D−1)×E+F is calculated. Based on the calculated result, in a case of FIG. 9, numbers 5 to 8 are assigned to the divided boards within the group 2.

Second Embodiment

With reference to FIG. 14 to FIG. 16, another form of data stored in the control device 40 will be described. In the embodiment as well, an example in which the electronic components are mounted on the printed circuit board 34 shown in FIG. 6 will be described by using the mounting head 22 shown in FIG. 5. In the embodiment as well, an example in which one electronic component is mounted on each divided board will be described. In addition, description of the same features as those described in the first embodiment may be omitted.

As described in FIG. 14, in the embodiment, one group 101 is configured by the divided boards 1 to 8. That is, the number of divided boards included in the group 101 is greater than the number (four) of the suction nozzles included in the mounting head 22.

FIG. 15 shows coordinates (origin) of the divided boards 1 to 8 and amounting order of the electronic components stored in the control device 40. That is, FIG. 15 shows the coordinates of the divided board and the mounting order included in the group 101. The coordinates of the divided board 2 to the divided board 8 correspond to the offset data (second offset data) with respect to the divided board 1 (reference divided board).

FIG. 16 shows a type (component A) of the electronic components mounted on the divided board 1, and center coordinates of the electronic components when the electronic components are mounted on the divided board 1. Specifically, the coordinates of the center position of the electronic component with respect to the coordinates (origin) of the divided board 1 are shown.

In the embodiment, by providing the data of FIGS. 14 to 16, it is possible to mount the electronic components in the same order as that of the first embodiment. According to the number of the suction nozzles included in the mounting head and the number of divided boards included in the printed circuit board, the same number of the divided boards as the number of the suction nozzles may be set as one group (first embodiment), and the divided boards of numbers greater than the number of the suction nozzles may be set as one group (second embodiment).

Third Embodiment

With reference to FIGS. 17 to 20, another form of data stored in the control device 40 and an order for mounting the electronic components on the printed circuit board 34 will be described. In the embodiment as well, an example in which the electronic components are mounted on the printed circuit board 34 shown in FIG. 6 will be described by using the mounting head 22 shown in FIG. 5. In the embodiment, a case where multiple components are mounted on one divided board will be described. In addition, description of the same features as those described in the first or second embodiment may be omitted.

FIG. 17 shows coordinates (origin of group 1 and group 2) of the group 1 and the group 2 stored in the control device 40. FIG. 18 shows coordinates of the divided boards 1 to 4, and amounting order of the electronic component stored in the control device 40. FIG. 19 shows center coordinates of the electronic components A and B when electronic components A and B are mounted on the divided board 1 (reference divided board), types (component A and component B) of the electronic components mounted on the divided board 1, and a type of the suction nozzle to be used.

As described in FIG. 19, in the embodiment, three electronic components are mounted within the divided board.

As described in FIG. 19, in a case of the embodiment, it is necessary to use two types of suction nozzles (nozzles A and B) so as to finish mounting of the electronic components (components A and B) on one divided board. When the suction nozzle is frequently replaced, productivity is reduced (time required for mounting electronic components becomes longer). Therefore, in the embodiment, the mounting of the electronic components is performed in an order in which replacement of the suction nozzle is reduced.

FIG. 20 shows an order for mounting the electronic components, a mounting position of the electronic components within the divided board, and a group on which the electronic components are mounted. As described in FIG. 20, in the embodiment, after the component A is mounted on a position "1" within the board of the groups 1 and 2, and the component A is mounted on a position "2" within the board of the groups 1 and 2 (see also FIG. 19). Thereafter, the component B is mounted on a position "3" within the board of the groups 1 and 2. That is, before mounting of the entire components (components A and B) with respect to the group 1 is finished, mounting of the component A with respect to the group 2 is performed, and the mounting of the component B with respect to the group 1 is performed again. More specifically, a position corresponding to the position "1" within the board shown in FIG. 19 is selected from each of the divided boards 1 to 4 (see also FIG. 9) included in the group 1. Accordingly, the components A sucked by using four suction nozzles are continuously mounted on the position "1" within the selected board. Thereafter, the components A are continuously mounted on the position "2" within the board of the boards 1 to 4 (mounting orders 1 and 2 of FIG. 20).

Next, the components A are continuously mounted on the position "1" within the board of the divided boards 5 to 8 included in the group 2, and the components A are continuously mounted on the position "2" within the board of the divided boards 5 to 8 (mounting orders 3 and 4 of FIG. 20). Thereafter, the entire four suction nozzles are replaced from a nozzle A to a nozzle B. Thereafter, the components B are continuously mounted on the position "3" within the board of the boards 1 to 4 (group 1), and the components B are continuously mounted on the position "3" within the board of the boards 5 to 8 (group 2) (mounting orders 5 and 6 of FIG. 20).

The mounting order of the electronic components shown in FIG. 20 is determined based on the offset data (first offset data) of the group 2 with respect to the reference group (group 1) shown in FIG. 17, the offset data (second offset data) of the divided boards 2 to 4 with respect to the reference divided board (divided board 1) shown in FIG. 18, the type of the electronic components mounted on the reference divided board shown in FIG. 19, and the type of the suction nozzles to be used. By providing the data of FIG. 20, it is possible to minimize the replacement of the suction nozzle, and shorten a production time.

In the third embodiment, four divided boards are set as one group. However, in a case where the multiple electronic components are mounted on the one divided board, the number of divided boards included within one group can be determined through the following procedures.

(1) When the number of the electronic components mounted on the one divided board is set as G, the number of the suction nozzles in which the mounting head is provided is set as H, and the number of divided boards included in the one group is set as I, the least common multiple J of the numerical value G and the numerical value H are calculated.

(2) The numerical value I=the least common multiple J/the numerical value G is calculated to be one group.

In addition, in the embodiment, an example using the mounting head in which four suction nozzles are disposed so as to form a rectangle is described. For example, it is possible to use the mounting head (rotary head) in which the multiple suction nozzles are disposed so as to form a circle. In this case, the number of divided boards included in the one group is determined based on the numerical value I (the number of divided boards included in one group) is calculated, the number of divided boards included in the printed circuit board, and the number of the electronic components mounted on the one divided board. With this, when the suction nozzle sucks the electronic component to be mounted last within one group, it is possible to efficiently perform sucking of the electronic components by sucking the electronic components to the entirety of the multiple suction nozzles. In addition, even in a case of the rotary head, it is possible to control an operation of the mounting head based on the mounting position data of the electronic components within one divided board among the multiple divided boards within one group, the offset data with respect to the one divided board of the multiple divided boards within one group, and order data for mounting the electronic components within one group.

Although specific examples of the present disclosure have been described in detail above, these are merely examples and do not limit the scope of the claims. The technology described in the scope of claims includes various changes and modifications of the specific examples exemplified above. The technical elements described in the present description or the drawings exhibit technical usefulness individually or in various combinations and are not limited to combinations described in claims at the time of filing. In addition, the technology exemplified in the present description or the drawings at the same time accomplishes multiple objectives and has technical usefulness by itself achieving one of them.

The invention claimed is:

1. An electronic component mounting machine, comprising
a mounting head configured to mount electronic components on a printed circuit board including multiple divided boards, the mounting head including multiple suction nozzles fixed relative to one another at a predetermined interval; and
processing circuitry configured to
set some of the multiple divided boards within the printed circuit board as one group based on the predetermined interval between the multiple suction nozzles and intervals between adjacent divided boards of the multiple divided boards within the printed circuit board, the some of the multiple divided boards being greater than one of the multiple divided boards and fewer than all of the multiple divided boards of the printed circuit board,
control a display to display an image obtained by overlapping an image of the printed circuit board with an image of the mounting head including a representation of the multiple nozzles, and
allow a user to set the one group by moving the image of the mounting head,
control the multiple suction nozzles to suck the electronic components to be mounted on the some of the divided boards within the one group at a same time, and
control an operation of the mounting head to mount the electronic components.

2. The electronic component mounting machine according to claim 1, wherein the processing circuitry is configured to store:
position data of one divided board among the some of the multiple divided boards within the one group,
offset data with respect to the one divided board of the some of the multiple divided boards within the one group, and
an order for mounting the electronic components sucked by the multiple suction nozzles.

3. The electronic component mounting machine according to claim 1, wherein the processing circuitry is configured to set the some of the multiple divided boards within the printed circuit board as the one group such that a difference between the predetermined interval between the multiple suction nozzles and the intervals between the adjacent divided boards is minimized.

4. The electronic component mounting machine according to claim 1, wherein
multiple groups are formed, and
the processing circuitry is configured to store offset data between respective groups.

5. The electronic component mounting machine according to claim 1, wherein the processing circuitry is configured to store offset data between respective groups, offset data between the some of the multiple divided boards within the one group, and mounting position data of multiple electronic components within one divided board of the multiple divided boards, when the multiple electronic components are mounted on the one divided board.

6. The electronic component mounting machine according to claim 5, wherein the processing circuitry is configured to determine an order for mounting the electronic components based on the offset data between respective groups, the offset data between the some of the multiple divided boards within the one group, and the mounting position data of the multiple electronic components within the one divided board.

7. The electronic component mounting machine according to claim 6, wherein
the processing circuitry is configured to select a mounting position of at least one electronic component from each of the some of the multiple divided boards included in the one group, and
the order for mounting is determined such that the electronic components are continuously mounted on the selected mounting positions using the multiple suction nozzles.

8. The electronic component mounting machine according to claim 1, wherein the multiple suction nozzles are four suction nozzles arranged in a rectangle.

9. The electronic component mounting machine according to claim 1, further comprising a data input device including the display and configured to input data to the processing circuitry, wherein
one divided board can be selected from the multiple divided boards, and
the selected divided board is displayed so as to be distinguished from an unselected divided board.

10. The electronic component mounting machine according to claim 9, wherein coordinate data of the selected divided board is displayed together with the image of the printed circuit board.

11. An electronic component mounting machine, comprising a mounting head configured to mount electronic components on a printed circuit board including multiple divided boards, the mounting head including multiple suction nozzles fixed relative to one another at a predetermined interval; and processing circuitry configured to:

set some of the multiple divided boards within the printed circuit board as one group based on the predetermined interval between the multiple suction nozzles and intervals between adjacent divided boards of the multiple divided boards within the printed circuit board, the some of the multiple divided boards being greater than one of the multiple divided boards and fewer than all of the multiple divided boards of the printed circuit board, take the predetermined interval as A, take an interval between adjacent divided boards as B, calculate an integer coefficient $\beta$ satisfying $A<0.5*B*\beta$, when a first divided board to be in a same group as that of a second divided board is separated from the second divided board by C positions, calculate C as $0.5*\beta$, take an integer part of C as D, set a third divided board at a position which is separated by D positions from the second divided board and the second divided board as the one group, control the multiple suction nozzles to suck the electronic components to be mounted on the some of the divided boards within the one group at a same time, and control an operation of the mounting head to mount the electronic components.

* * * * *